United States Patent

Krijn et al.

[11] Patent Number: 5,986,269
[45] Date of Patent: Nov. 16, 1999

[54] CORRECTION DEVICE FOR CORRECTING CHROMATIC ABERRATION IN PARTICLE-OPTICAL APPARATUS

[75] Inventors: Marcellinus P. C. M. Krijn; Alexander Henstra; Karel D. van der Mast, all of Eindhoven, Netherlands

[73] Assignee: U.S. Philips Corporation, New York, N.Y.

[21] Appl. No.: 08/932,981

[22] Filed: Sep. 18, 1997

[30] Foreign Application Priority Data

Sep. 20, 1996 [NL] Netherlands ................. 96202638

[51] Int. Cl.$^6$ ................. H01J 37/10; H01J 37/145
[52] U.S. Cl. ................. 250/396 R; 245/296 ML
[58] Field of Search ................. 250/396 R, 396 ML, 250/398

[56] References Cited

U.S. PATENT DOCUMENTS

| | | | |
|---|---|---|---|
| 2,919,381 | 12/1959 | Glaser | 250/396 R |
| 4,362,945 | 12/1982 | Riecke | 250/396 ML |
| 4,684,808 | 8/1987 | Plies et al. | 250/396 R |
| 4,962,309 | 10/1990 | White et al. | 250/396 R |
| 4,962,313 | 10/1990 | Rose | 250/396 R |

FOREIGN PATENT DOCUMENTS

0373399B1   6/1990   European Pat. Off. ....... H01J 37/153

*Primary Examiner*—Bruce C. Anderson
*Attorney, Agent, or Firm*—Fulbright & Jaworski, LLP

[57] ABSTRACT

Particle-optical rotationally symmetrical lenses inevitably have chromatic aberration. This lens fault determines the limit of the resolution of known particle-optical apparatus at a comparatively low acceleration voltage (0.5 kV to 5 kV) of the particle beam. This lens fault cannot be eliminated by compensation by means of rotationally symmetrical fields. In order to enhance the resolution of the particle-optical apparatus nevertheless, it has already been proposed to mitigate said lens fault by means of a Wien type corrector. Such a known configuration is provided with a number of electrical and magnetic multipoles. In order to achieve easier adjustment of the various multipole fields, the pole faces (30-i) governing the multipole fields according to the invention have a specific length $L=(2\pi^2 n^2)/(K_{obj}^2 C_{c,obj})$, in which $K_{obj}$ is the strength of the focusing lens to be corrected and $C_{c,obj}$ is the coefficient of chromatic aberration of this lens.

12 Claims, 5 Drawing Sheets

| 10μm

CORRECTION DEVICE FOR CORRECTING CHROMATIC ABERRATION IN PARTICLE-OPTICAL APPARATUS

The invention relates to a particle-optical apparatus, including:
- a particle source for emitting a beam of electrically charged particles which travel along an optical axis of the apparatus in order to irradiate an object to be irradiated in the apparatus by means of the particle beam,
- a focusing lens for focusing the beam of electrically charged particles,
- and a correction device for correcting lens aberrations of the focusing lens,
  - which correction device comprises pole faces for producing a uniform electrical field and a uniform magnetic field which extends perpendicularly thereto, both dipole fields also extending perpendicularly to the optical axis of the apparatus,
  - which correction device also comprises pole faces for producing an electrical quadrupole field, which pole faces extend substantially parallel to the optical axis of the apparatus.

The invention also relates to an assembly which consists of a focusing lens for focusing a beam of electrically charged particles and of a correction device for correcting lens aberrations of the focusing lens and is intended for use in such an apparatus.

A correction device of this kind, intended for use in such an apparatus, is known from European Patent No. 0 373 399.

Generally speaking, particle-optical apparatus, such as electron microscope or apparatus for electron lithography, are arranged to irradiate an object to be studied or worked by means of a beam of electrically charged particles (usually an electron beam) which is produced by means of a particle source, such as a thermal electron source or an electron source of the field-emission type. Irradiation of the object may be aimed at imaging such objects to be studied in such apparatus (specimens in electron microscopes) or at forming very small structures on the object, for example for microelectronics (electron lithography apparatus). In both cases focusing lenses are required to focus the electron beam.

The electron beam can in principle be focused in two ways. According to the first method, a specimen to be examined is more or less uniformly exposed to the electron beam and an enlarged image of the specimen is formed by means of the focusing lens. The focusing lens is in that case the objective lens of an imaging lens system; the resolution of the objective lens then governs the resolution of the apparatus. Apparatus of this kind are known as Transmission Electron Microscopes (TEM). According to a second method of focusing, the emissive surface of the electron source, or a part thereof, is imaged, be it usually strongly reduced, on the specimen to be examined (in the Scanning Electron Microscope or SEM) or on an object on which the desired microstructure is to be formed (in lithography apparatus). The image of the electron source (the "spot" which is displaced across the object by means of, for example deflection coils) is again formed by means of an imaging lens system. In the latter case the focusing lens is the objective lens of the spot-forming lens system; the resolution of this objective lens governs the spot size of the beam, and hence the resolution of the apparatus.

The lenses used in all such apparatus are usually magnetic lenses, but may also be electrostatic lenses. Both types of lens are practically always rotationally symmetrical lenses. The behavior of such lenses inevitably is not ideal, i.e. they exhibit lens aberrations, among which the so-called spherical aberration and the chromatic aberration are usually decisive in respect of resolution of the lens; these lens aberrations thus determine the limit of the resolution of the known electron-optical apparatus. According to a fundamental theorem of particle-optics, such lens aberrations cannot be eliminated by compensation utilizing rotationally symmetrical electrical or magnetic fields.

In contemporary electron optical apparatus, notably in scanning particle-optical apparatus comprising a spot-forming objective lens (the so-called Scanning Electron Microscope or SEM), there is a tendency to select the acceleration voltage of the electron beam so as to have a value which is lower than was customary thus far, i.e. of the order of magnitude of from 0.5 kV to 5 kV instead of the previously customary voltage of the order of magnitude of 30 kV or more. The reason for doing so is that at such comparatively low acceleration voltage the charging of non-conductive specimens (such as photoresist material in the case of manufacture of electronic integrated circuits) is substantially reduced; moreover, at these low voltages the so-called topographic contrast can be substantially enhanced. At such low acceleration voltages the chromatic aberration is the major lens aberration, so the decisive factor in respect of resolution of the particle-optical apparatus. (This can be readily understood by considering the fact that the chromatic aberration is proportional to $\Delta U/U$, in which $\Delta U$ is the non-variable energy spread in the electron beam and $U$ is the nominal acceleration voltage; this factor, therefore, increases as $U$ is decreased.)

In order to enhance the resolution of the particle-optical apparatus nevertheless, the cited European Patent No. 373 399 proposes to reduce of said lens aberrations by means of a correction device having a non-rotationally symmetrical structure. This structure is formed by a Wien-type corrector, that is to say a structure in which a uniform electric field and a uniform magnetic field which extends perpendicularly thereto are both oriented perpendicularly to the optical axis of the apparatus. For the correction of spherical aberration as well as chromatic aberration, this corrector is provided with a number of multipoles, i.e. an electrical and a magnetic quadrupole, an electrical and a magnetic hexapole, and an electrical and/or a magnetic octupole. (Thus, in this known correction device it may occur that only the electrical field or only the magnetic field of the octupole fields is present.)

An embodiment of the correction device according to the cited European Patent (described with reference to FIG. 5 and denoted therein by the reference numeral 20) enables correction of the chromatic aberration. This embodiment consists of a multipole unit which is formed by a number of electrical and magnetic poles whose pole faces are axially oriented, i.e. extend parallel to the optical axis of the apparatus. Each of said poles can be separately excited; by suitably choosing the individual excitations, therefore, a multipole unit thus constructed can form, as desired, a uniform electrical field extending perpendicularly to the optical axis and a uniform magnetic field which extends perpendicularly thereto, both fields extending perpendicularly to the optical axis; thereon superposed electrical and magnetic quadrupole fields, hexapole fields and an electrical and/or a magnetic octupole field can be formed.

In such a comparatively complex correction device it is extremely difficult to find the correct electrical and magnetic adjustment for the (very accurate) generation of said multipole fields. This difficulty becomes more serious as the number of multipole fields to be generated is greater, because each of these fields must have and retain exactly the adjusted correct value. Therefore, it is of essential importance to minimize the number of multipole fields required.

It is an object of the invention to provide a particle-optical apparatus of the kind set forth in which correction takes place only for the chromatic aberration of the focusing lens, and in which the requirements in respect of electrical and magnetic adjustment and reproducibility can be more readily satisfied.

To this end, the particle-optical apparatus according to the invention is characterized in that for the length L in the direction of the optical axis of the pole faces determining the multipole fields it holds that this length is substantially equal to $(2\pi^2 n^2)/(K_{obj}^2 C_{c,obj})$ in which n is the number of periods of the sinusoidal trajectory of the particles of the beam in the correction device, $K_{obj}$ is the strength of the focusing lens to be corrected, and $C_{c,obj}$ is the coefficient of chromatic aberration of this lens.

The invention is based on the insight that for the various multipoles in the correction device an excitation can be found at which the chromatic aberration is corrected and for which only dipole fields and quadrupole fields need be used. As a result, only a limited number of power supplies is required, so that the number of variables involved in the adjustment of the correction device is substantially smaller than in the correction device which is known from the cited European Patent.

It is to be noted that in a first-order approximation the trajectory of the particles of the beam is shaped as a sinusoid, the starting point and the end point being dependent on the height and the direction with which the particle enters the field to be traversed. Thus, depending on the initial situation, the trajectory could also be considered to be cosinusoidal. In the context of the present invention a sinusoidal trajectory of the particles of the beam is to be understood to mean a trajectory which is shaped as a part of a sinusoid, regardless of the initial height and the initial slope of this trajectory.

According to a further embodiment of the invention, dipole fields and quadrupole fields of the correction device have a strength such that the electrically charged particles traveling along the optical axis of the apparatus describe a trajectory with a sinusoid of substantially one period.

For the strength of said fields thus adjusted, the dimension of the correction device, i.e. the length L, has a minimum value; this is of importance with a view to building the device into a particle-optical apparatus.

According to a preferred embodiment of the invention, the correction device is provided with pole faces which, with the exception of the pole face for producing the uniform magnetic field, are arranged to produce exclusively electrical fields.

It is attractive to generate the desired multipole fields in the form of electrical fields as much as possible. This is because the generation of magnetic fields always requires poles of a ferromagnetic material, which poles inevitably exhibit magnetic hysteresis which, moreover, often is also time dependent, and a non-linear magnetic behavior, i.e. the field strength of the magnetic field produced by said material is not directly proportional to the excitation current through the coils whereby said field is generated; such non-linear behavior is undesirable with a view to achieving accurate adjustment of the field. Furthermore, due to the finite magnetic permeability of these materials, the magnetic field generated by means of this material is dependent on the location in the material; in other words, the pole faces do not exactly form a surface of constant and uniform magnetic potential, so that in such a case the field shape that could be expected on the basis of the design of the pole structure will not be obtained exactly.

If the particle-optical apparatus is a scanning particle-optical apparatus with a spot-forming objective lens, it is advantageous to arrange the particle source ahead of the objective lens, looking from the correction device. The correction device can then be arranged as near as possible to the objective lens, so that any residual image artefacts, due to the finite distance between the correction device and the objective, are not unnecessarily enlarged. If necessary, a set of deflection coils for the scanning motion of the beam can then be arranged between the correction device and the objective; these coils are comparatively small and have hardly any or no effect on the distance between the correction device and the objective. The correction device can then be arranged as closely as possible to the objective lens.

The invention will be described in detail hereinafter with reference to the Figures. Therein.

Figure 1:
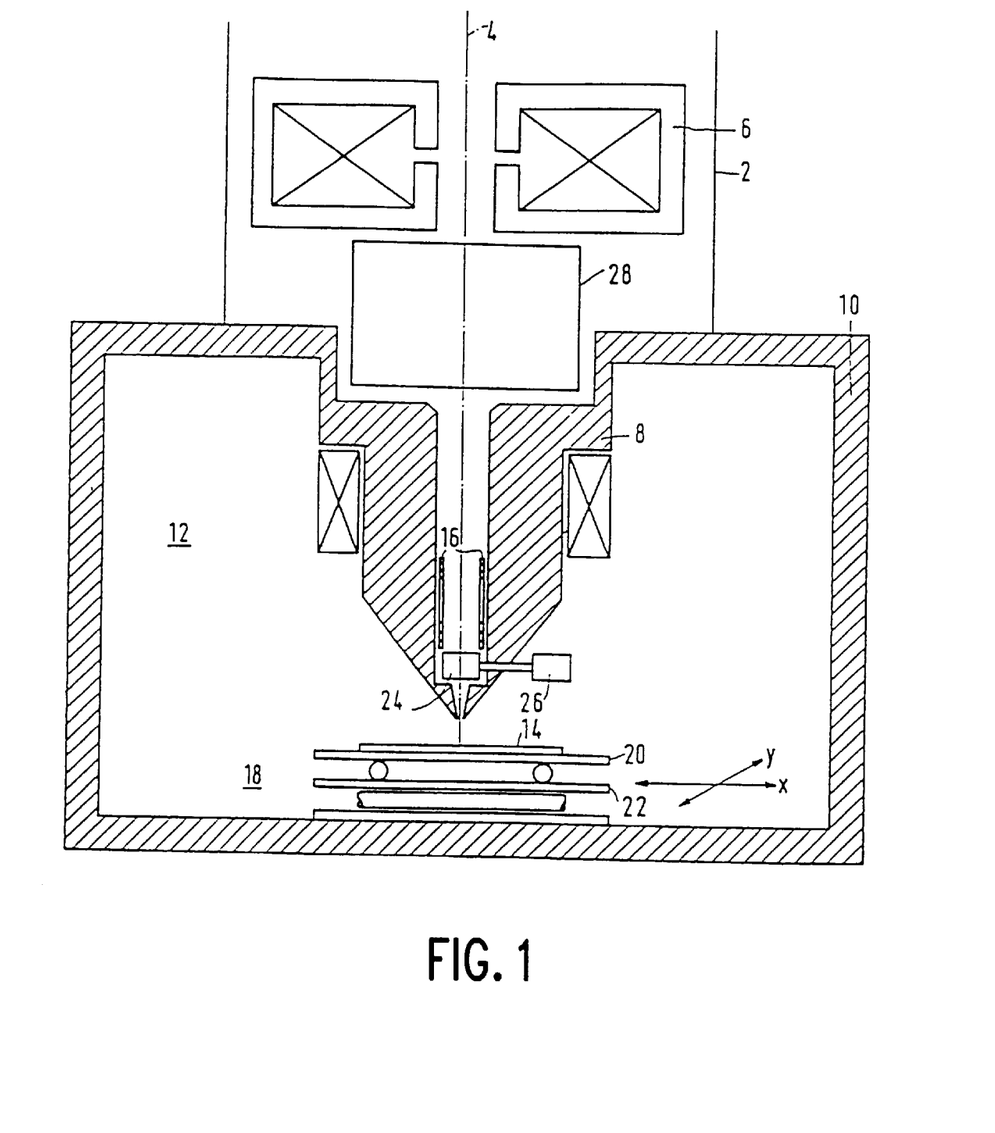
FIG. 1 shows diagrammatically a relevant part of a particle-optical instrument in which the correction device according to the invention can be used.

FIG. 1 shows a particle-optical instrument in the form of a part of a column 2 of a scanning electron microscope (SEM). As is customary, an electron source (not shown in the Figure) in this instrument produces a beam of electrons which travels along the optical axis 4 of the instrument. This electron beam can pass through one or more electromagnetic lenses, such as the condenser lens 6, after which it reaches the objective lens 8. This lens, being a so-called monopole lens, forms part of a magnetic circuit which also consists of the wall 10 of the specimen chamber 12. The objective lens 8 is used to form, via the electron beam, a focus whereby an object, being the specimen 14, is scanned. Scanning takes place by moving the electron beam across the specimen in the x-direction as well as the y-direction by means of scan coils 16 provided in the objective lens 8. The specimen 14 is arranged on a specimen table 18 which comprises a carrier 20 for the x-displacement and a carrier 22 for the y-displacement. Using these two carriers, a desired region of the specimen can be selected for examination. Imaging in this microscope is realized in that secondary electrons are released from the specimen, which electrons move back in the direction of the objective lens 8. These secondary electrons are detected by a detector 24 provided in the bore of this lens. A control unit 26 is connected to the detector in order to activate the detector and to convert the stream of detected electrons into a signal which can be used to form an image of the specimen, for example by means of a cathode ray tube (not shown). Between the condensor 6 and the objective lens 8 there is arranged a correction device 28 which will be described in detail hereinafter and which serves to correct the chromatic aberration and the spherical aberration of the objective lens.

Figure 2:
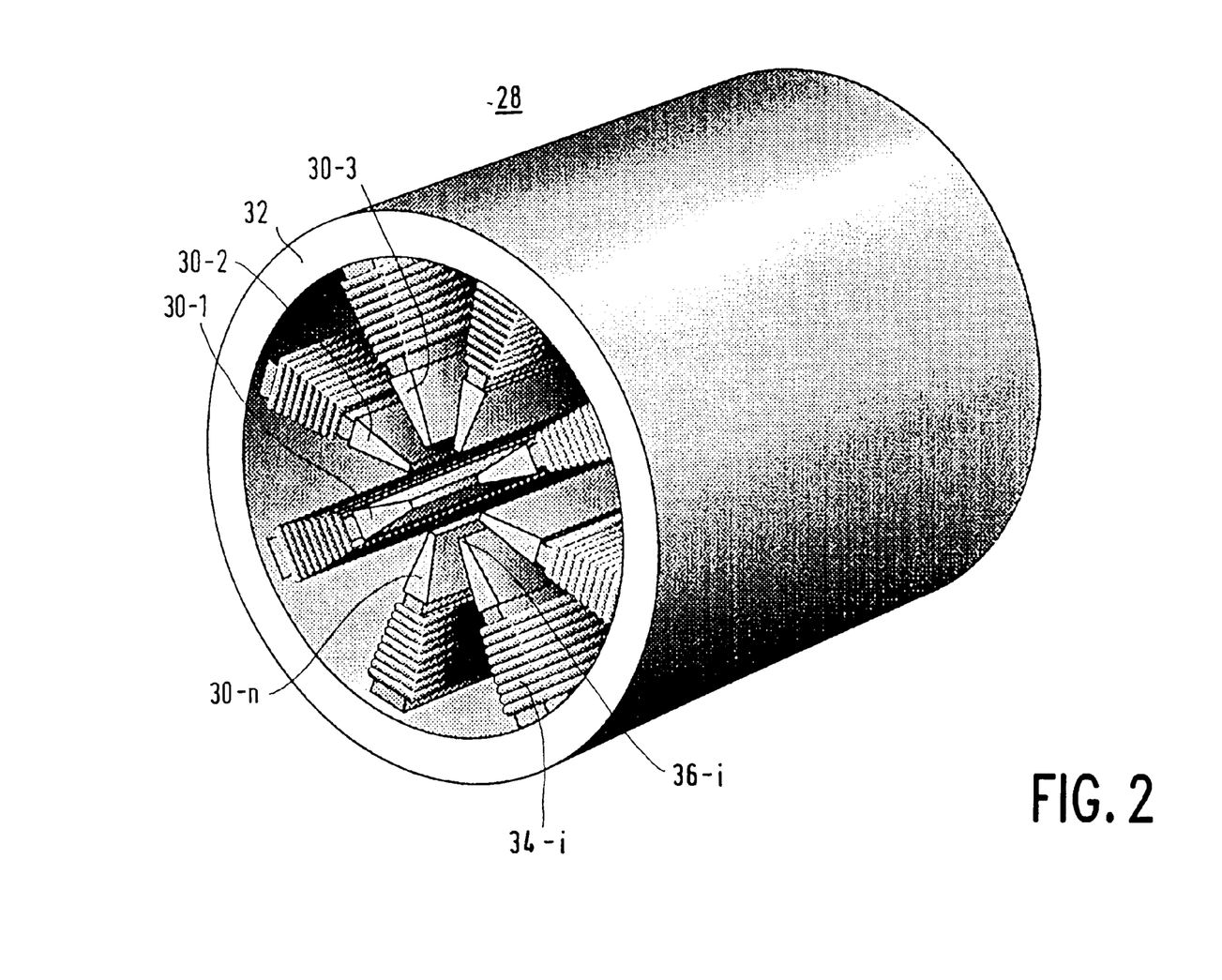
FIG. 2 is a perspective view of an embodiment of a correction device for use in a particle-optical instrument according to the invention.

FIG. 2 is a perspective view of an embodiment of a correction device for use in a particle-optical instrument, for example as denoted by the reference numeral 28 in FIG. 1. The correction device is formed by a magnetic circuit which consists of a cylindrical jacket 32 in which a number n of poles 30-1 to 30-n is provided so as to be uniformly distributed across the cylinder, n in this Figure being equal to 8. Even though in principle the implementation of the invention does not require multipole fields of an order higher than quadrupoles, for the compensation of mechanical imperfections it is desirable to have a facility for generating higher-order fields, for example n=8 as in this Figure; n=12 is also feasible. This possibility, however, is not of essential importance to the invention. The cylinder axis of the jacket 32 coincides with the optical axis 4 of the particle-optical instrument shown in FIG. 1.

The various multipole fields, i.e. the magnetic fields as well as the electrostatic fields, are generated by means of the n poles. Each of these poles is arranged to generate an electrical as well as a magnetic field; the pole faces determining said multipole fields extend parallel to the optical axis of the apparatus. Each pole 30-i is provided with an excitation coil 34-i for generating a magnetic field and with a pole cap 36-i for generating an electrical field. Each of the excitation coils 34-i and each of the pole caps 36-i can be individually excited, so that each of the desired multipole fields (electrical as well as magnetic) can be generated by means of the 8 poles 30-1 to 30-8.

Figure 3A:
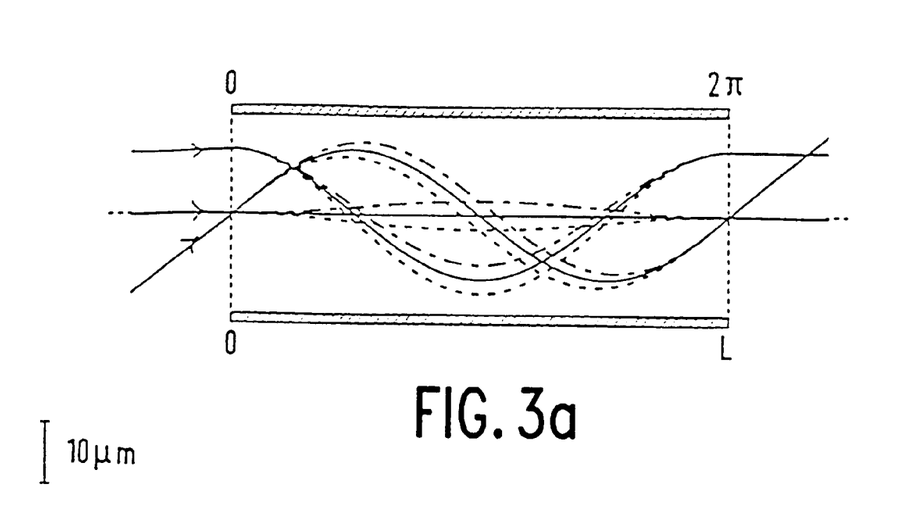
FIGS. 3a and 3b show diagrammatically the trajectory of some electron rays with a sinusoid of one period in two mutually perpendicular planes in a correction device according to the invention.
Figure 3B:
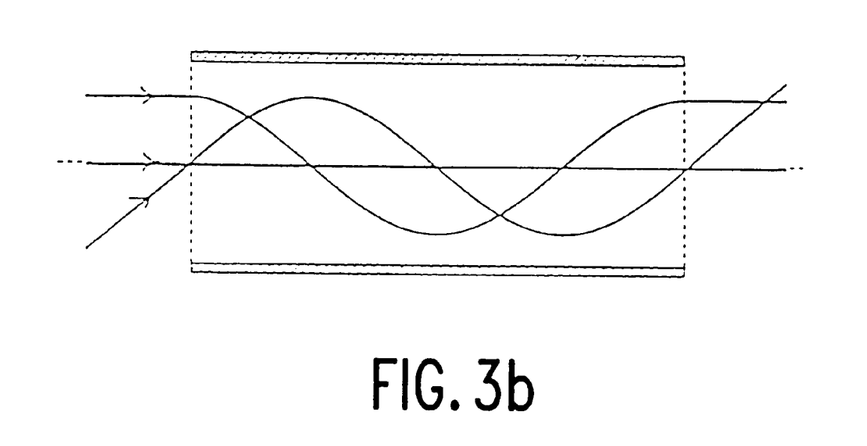

FIG. 3 shows the trajectory of some electron rays with a sinusoid of one period in a correction device as shown in FIG. 2. FIG. 3a shows the trajectory in a plane through the optical axis and FIG. 3b in a plane perpendicular to the former plane. The former plane is referred to as the x-z plane, the x-direction extending parallel to the electric field lines of the electric dipole whereas the z-direction is the direction of the optical axis. The solid lines represent the trajectories of electrons having the nominal energy of 1 keV; the dash-dot lines represent the trajectories of electrons with a deviation of 0.2 eV with respect to the nominal energy. In both Figures a pole length (i.e. the length of the correction unit) of 100 mm has been assumed and also an inner radius of the boundary circle of the pole faces of 2 mm. (The shaded boundary faces in the two Figures, therefore, are not a boundary to scale.) In order to give an impression of the deviations of the trajectories relative to the optical axis, a graduation stroke of 10 μm is shown in the Figures. The x-z plane shown in FIG. 3a is the symmetry plane of the electrical multipoles. Magnetic multipoles, if any, extend perpendicularly to these electrical multipoles. The plane extending perpendicularly to the x-z plane, that is to say the plane shown in FIG. 3b, is referred to as the y-z plane.

The first-order equation of the electron trajectories in the x-z plane of FIG. 3a is:

$$x(z) = x_0 \cos(\kappa z) + x'_0 \frac{1}{\kappa} \sin(\kappa z) + \frac{\Delta U}{U_0} \frac{\sqrt{2}}{2} \frac{1}{\kappa} [1 - \cos(\kappa z)] \quad (1)$$

whereas for the first-order equation of the electron trajectories in the y-z plane according to FIG. 3b it holds that:

$$y(z) = y_0 \cos(\kappa z) + y'_0 \frac{1}{\kappa} \sin(\kappa z) \quad (2)$$

The symbols in the expressions (1) and (2) have the following meaning:

x, y and z are the position coordinates of the relevant electron;

$x_0$ and $y_0$ are the values of x and y, respectively, at the location z=0, i.e. at the entrance of the correction device;

$x'_0$ and $y'_0$ are the slope in the z-direction of the trajectory in the x-plane and the y-plane, respectively, at the location z=0;

$\Delta U$ is the deviation of the energy of the electrons with respect to the nominal energy $U_0$, and $\kappa = (E_1 \sqrt{2})/(4U_0)$, in which $E_1$ is the coefficient of the term −x in the series development of the electrical potential in x and y.

The expressions (1) and (2) show that in the correction device dispersion occurs only in the x-z plane (the variable $\Delta U$ occurs only in the expression (1)), and that the y-z plane is free from dispersion.

The adjustment of the correction device, i.e. the choice of the values of the currents and voltages whereby the poles 30-i (see FIG. 2) are excited, is based on the following criteria.

First of all there is the requirement that an electron of nominal energy $U_0$ on aggregate may not experience deflection in the correction device. This means that an electron of nominal energy which initially follows the optical axis again has to travel along the optical axis after its departure from the correction device. This requirement is satisfied if:

$$E_1 - v_0 B_1 = 0 \quad (3)$$

The symbols in the expression (3) which have not yet been explained have the following meaning:

$B_1$ is the coefficient of the term −y in the series development of the magnetic potential to x and y, and $v_0$ is the velocity of the electron associated with the accelerating potential $U_0$.

If the expression (3), the so-called Wien condition, is satisfied, the electrical and magnetic quadrupole components must be chosen in such a manner that, moreover, the requirement is satisfied that the behavior of the correction device in the x-z plane should be the same as its behavior in the y-z plane; this is referred to as the double focusing condition. This condition is:

$$E_2 - v_0 B_2 = -\frac{E_1^2}{8U_0} \quad (4)$$

The symbols in the expression (4) which have not yet been explained have the following meaning:

$E_2$ is the coefficient of the term $-(x^2-y^2)$ in the series development of the electrical potential to x and y, and $B_2$ is the coefficient of the term −2xy in the series development of the magnetic potential to x and y.

For a selected value of $E_1$ the expression (4) establishes a relationship between $E_2$ and $B_2$, where one of these two can still be chosen as desired. Because of the already mentioned drawbacks of magnetic poles, preferably electrical fields are used wherever possible. Therefore, the term $B_2$ is preferably chosen to be equal to zero. The expression (4) then becomes:

$$E_2 = -\frac{E_1^2}{8U_0} \qquad (5)$$

In order to ensure, moreover, that the correction device does not exhibit dispersion from its entrance to its exit, the last term in the expression (1), being proportional to $\Delta U/U_0$, must be equal to zero. For a correction device of length L this requirement is satisfied if $\kappa = n.2\pi/L$, or $\kappa = (E_1 \sqrt{2})/(4U_0)$:

$$E_1 = n \cdot 4\pi\sqrt{2}\,\frac{U_0}{L} \qquad (6)$$

For n=1, the expression (6) is called the $2\pi$-condition.

For correction of the chromatic aberration it is necessary to satisfy the condition that the chromatic aberration of the correction device is rotationary symmetrical and that, moreover, it opposes that of the objective to be corrected. The first condition is called the absence of chromatic astigmatism condition and the second condition the achromatic condition. The above of absence of chromatic astigmatism condition can be expressed in a formule as:

$$E_3 - v_0 B_3 = -\frac{E_1^3}{32U_0^2} - \frac{E_1 E_2}{4U_0} \qquad (7)$$

The symbols in the expression (7) which have not yet been explained have the following meaning:

$E_3$ is the coefficient of the term $-(x^3-3xy^2)$ in the series development of the electrical potential to x and y, and $B_3$ is the coefficient of the term $-(3x^2y-y^3)$ in the series development of the magnetic potential to x and y.

If the term $B_2$ is chosen to equal zero, insertion of expression (5) in expression (7) demonstrates that the right-hand term of the expression (7) becomes zero:

$$E_3 - v_0 B_3 = 0 \qquad (8)$$

The expression (8) thus obtained establishes an unambiguous relationship between $E_3$ and $B_3$.

The above achromatic condition can be written as:

$$E_2 = \frac{E_1^2}{4U_0}\left(-1 + \frac{1}{n}\frac{\sqrt{2}}{\pi}\frac{U_0}{E_1} C_{c,obj} K_{obj}^2\right) \qquad (9)$$

The symbols in the expression (9) which have not yet been explained have the following meaning:

$C_{c,obj}$ is the coefficient of chromatic aberration of the objective to be corrected, and $K_{obj}$ is the strength of the objective to be corrected; this value equals the reciprocal value of the focal distance $f_{obj}$.

The expressions (5) and (9) both represent a formule for $E_2$; these two expressions can be equal only if the right-hand term of the expression (9) equals the right-hand term of the expression (5); this can be rewritten as:

$$E_1 = \frac{1}{n}\frac{2\sqrt{2}}{\pi} U_0 C_{c,obj} K_{obj}^2 \qquad (10)$$

By eliminating $E_1$ from the resultant expression (10) by means of the expression (6), the condition is obtained which, according to the invention, must be satisfied by the length L, in the direction of the optical axis (4), of the pole faces (30-i) determining the multipole fields in order to correct the chromatic aberration of the objective lens 8. This expression is:

$$L = \frac{2\pi^2 n^2}{C_{c,obj} K_{obj}^2} \qquad (11)$$

It is also desirable that the spherical aberration of the correction device itself is rotationally symmetrical. This condition leads to two requirements. The first requirement is called the absence of axial astigmatism condition and the second requirement the absence of axial star aberration condition. Combination of these two requirements yields the following two expressions:

$$E_3 = \frac{10E_2^2}{9E_1} - \frac{E_1^3}{72U_0^2} + \frac{E_1 E_2}{36U_0} \qquad (12)$$

and $$E_4 - v_0 B_4 = -\frac{29}{4608}\frac{(E_1^2 + 8E_2 U_0)^2}{U_0^3} \qquad (13)$$

The symbols in the expression (13) which have not yet been explained have the following meaning:

$E_4$ is the coefficient of the term $-(x^4-6x^2y^2+y^4)$ in the series development of the electrical potential to x and y, and $B_4$ is the coefficient of the term $-(4x^3y-4xy^3)$ in the series development of the magnetic potential to x and y.

When the expression (5) is inserted for $E_2$ in the expression (12), it appears that $E_3$ becomes equal to zero. It appears from the expression (8) that $B_3$ also becomes zero, so that no third-order terms at all need be present (so no hexapoles from a physical point of view). Furthermore, when the expression (5) is inserted for $E_2$ in the expression (13), it appears that the right-hand term of the expression (13) becomes equal to zero, so that $E_4 - v_0 B_4 = 0$. Further calculation shows that no contradiction arises with respect to other conditions if $E_4$ and $B_4$ are both chosen to be equal to zero. In that case no fourth-order terms at all need be present (so no octupoles from a physical point of view).

If the conditions for the multipole fields according to the expressions (3) to (13) have been satisfied, the expression for the spherical aberration of the correction device itself (for the case n=1) is given by:

$$C_{s,corr} = -\frac{K_{obj}^2 C_{c,obj}^3}{\pi^2} \qquad (14)$$

The symbols in the expression (14) which have not yet been explained have the following meaning:

$C_{s,corr}$ is the coefficient of spherical aberration of the correction device itself, and $C_{c,corr}$ is the coefficient of chromatic aberration of the correction device itself.

It is to be noted that for complete correction of the chromatic aberration of the objective to be corrected the coefficient of chromatic aberration of the correction device itself, $C_{c,corr}$, must be equal to and have the opposite sign with respect to the coefficient of chromatic aberration of the objective to be corrected, $C_{c,obj}$, so $C_{c,corr} = -C_{c,obj}$.

In respect of the sign of the coefficient of spherical aberration it is to be noted that it is chosen so that it is positive for a rotationally symmetrical lens. This means that in conformity with the expression (14) the correction device itself has a negative coefficient of spherical aberration. The numerical value of this coefficient, however, is much smaller than that of the objective to be corrected. Therefore, this correction device is not capable of correcting spherical aberration of the focusing lens. However, such correction can be performed by preserving the hexapole fields in the correction device according to the invention, by splitting the correction device thus obtained into two equal sections, each amounting to half the length, and by adding a hexapole field of opposite intensity to each of said halves as described in a Patent Application in the name of Applicant which has not yet been published at the date of filing of the present Patent Application.

The procedure for adjusting a particle-optical apparatus provided with a correction device according to the invention is roughly as follows:

1) in the non-activated state of the correction device an image with an enlargement of, for example 10,000 is made of a small object, for example a latex ball having a diameter of the order of magnitude of 0.25 $\mu$m;

2) the axis of the electric quadrupole is aligned with the optical axis by shifting, with a varying quadrupole strength $E_2$, the quadrupole and the electron beam relative to one another until image shift no longer occurs;

3) the multipole strengths are subsequently adjusted to their nominal values in conformity with the expressions (3) to (13);

4) $E_1$ is then adjusted so as to satisfy the $2\pi$-condition, $B_1$ being adjusted at the same time so as to satisfy the Wien condition; the object is focused by $E_1$ whereas the beam shift is minimized by adjustment of $B_1$;

5) the double focusing condition is satisfied by $E_2$ by minimizing the astigmatism;

6) the steps 2, 4 and 5 are repeated until a final situation is reached in which said conditions have been satisfied.

Figure 4:
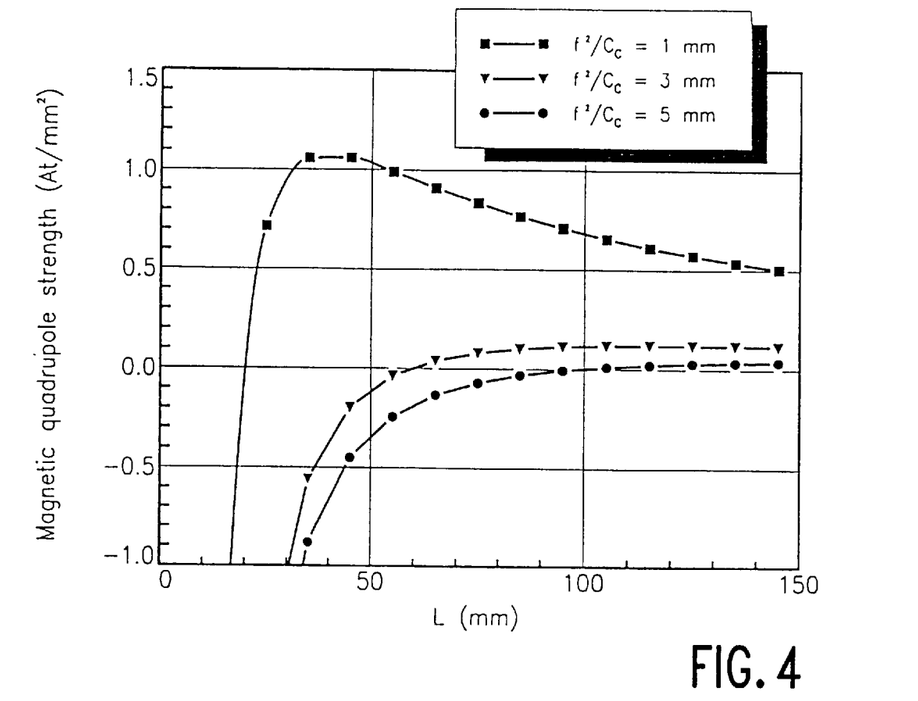
FIG. 4 shows graphically the variation of the magnetic quadrupole strength $B_2$ in dependence on the length L of the correction unit.

FIG. 4 shows graphically the variation of the magnetic quadrupole strength $B_2$ (expressed in Ampere turns (At) per mm$^2$) in dependence on the length L of the correction unit. This Figure shows three graphs for three values of the relevant parameters of the focusing lens to be corrected, i.e. $(K^2C_c)^{-1}=1$ mm (denoted by squares), $(K^2C_c)^{-1}=3$ mm (denoted by triangles) and $(K^2C_c)^{-1}=5$ mm (denoted by circles). The acceleration voltage $U_0$ of the electron beam amounted to 1000 V and the number of periods n of the sinusoidal trajectory of the electrons equals 1. Each of these graphs clearly shows that there is a value for L for which the magnetic quadrupole strength $B_2$ can be chosen to be equal to zero; these values lie at approximately 20 mm, 60 mm and 100 mm, respectively.

Figure 5:
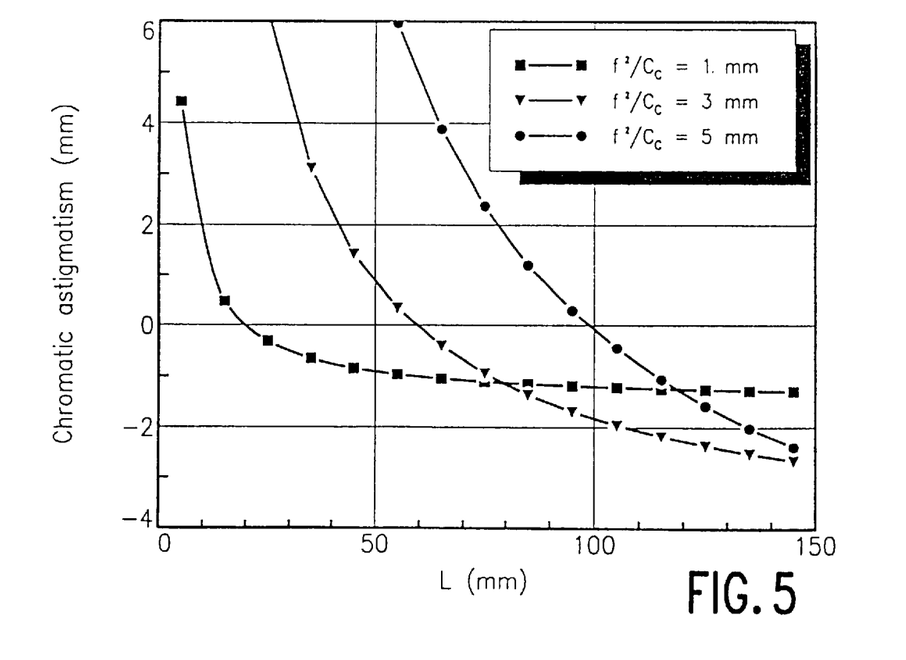
FIG. 5 shows graphically the variation of the chromatic astigmatism in dependence on the length L of the correction unit.

FIG. 5 shows graphically the variation of the chromatic astigmatism (see the expression (7)), expressed in mm, in dependence on the length L of the correction unit. Like FIG. 4, FIG. 5 shows three graphs for three values of the relevant parameters of the focusing lens to be corrected, i.e. $(K^2C_c)^{-1}=1$ mm (denoted by squares), $(K^2C_c)^{-1}=3$ mm (denoted by triangles) and $(K^2C_c)^{-1}=5$ mm (denoted by circles). The acceleration voltage $U_0$ of the electron beam amounted to 1000 V and the number of periods n of the sinusoidal trajectory of the electrons equals 1. Each of these graphs clearly shows that for the values of L for which the magnetic quadrupole strength $B_2$ becomes zero (approximately at 20 mm, 60 mm and 100 mm, respectively), the chromatic astigmatism also becomes zero.

Figure 6:
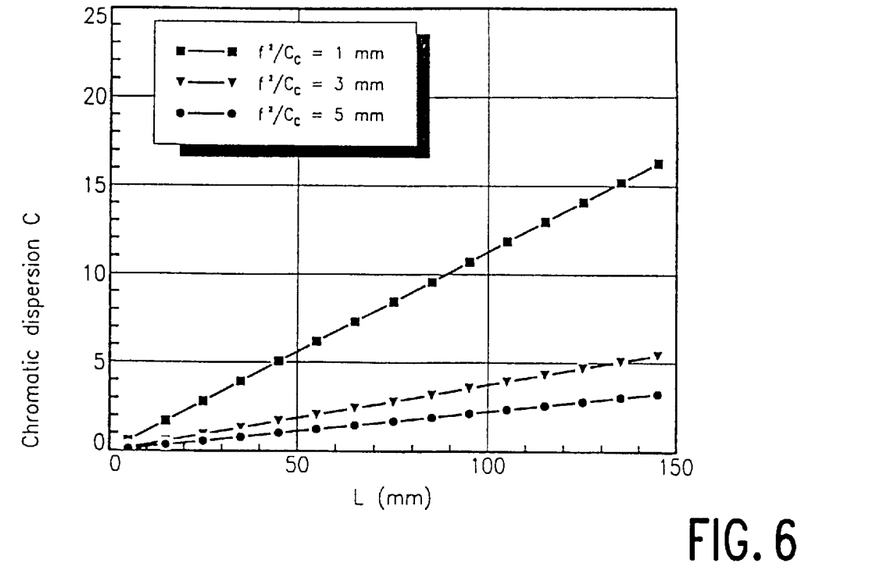
FIG. 6 shows graphically the variation of the coefficient of chromatic dispersion in dependence on the length L of the correction unit.

FIG. 6 shows graphically the variation of the coefficient of chromatic dispersion C. For the definition of this coefficient of chromatic dispersion C it is assumed that the electrons enter the correction device parallel to the optical axis and that they emanate from this device at an angle x' relative to the optical axis. The chromatic dispersion then causes an angular deviation $\Delta$x' which is proportional to the square of the relative energy spread, $(\Delta U/U_0)^2$, in which the proportionality constant is defined as the coefficient of chromatic dispersion C; this can be written as: $\Delta x'=C.(\Delta U/U_0)^2$.

Like the FIGS. 4 and 5, FIG. 6 shows three graphs for three values of the relevant parameters of the focusing lens to be corrected, i.e. $(K^2C_c)^{-1}=1$ mm (denoted by squares), $(K^2C_c)^{-1}=3$ mm (denoted by triangles) and $(K^2C_c)^{-1}=5$ mm (denoted by circles). The acceleration voltage $U_0$ of the electron beam amounted to 1000 V and the number of periods n of the sinusoidal trajectory of the electrons equals 1. It has already been stated with reference to FIG. 4 that the values of L for which the magnetic quadrupole strength $B_2$ can be chosen equal to zero are approximately 20 mm, 60 mm and 100 mm, respectively. FIG. 6 shows that in all three cases the coefficient of chromatic dispersion C has a value of approximately 2 radians. For a relative energy spread of $\frac{1}{1000}$, this is a value which is still acceptable in many practical cases. However, should this value become too high, this coefficient can in principle be made equal to zero by modification of the present correction device. This is achieved by choosing the length L of the correction device to be such that the number of periods n of the sinusoidal trajectory of the electrons in the correction device equals two (the overall length L is then increased by a factor 4) and by arranging the second half of the correction device (i.e. the part in which the second half of the sinusoidal trajectory extends) so as to be rotated 180° around the optical axis. In a correction device thus formed the coefficient of chromatic dispersion C equals zero.

Figure 7:
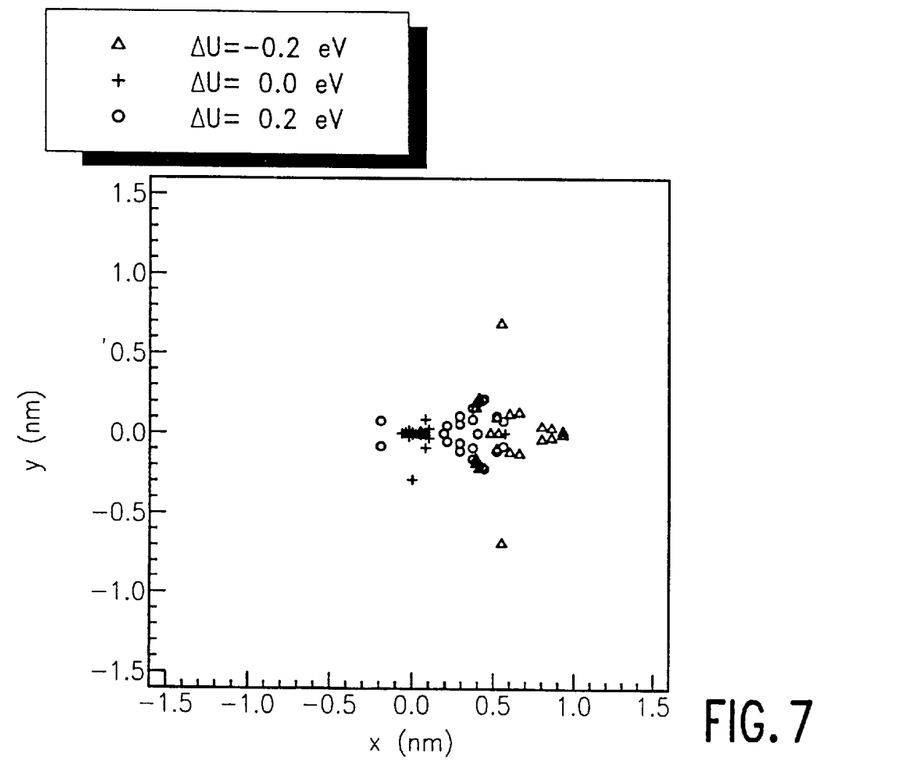
FIG. 7 shows graphically anomalies in the focusing of an electron spot due to chromatic aberration, using a correction device according to the invention, for various values of the energy spread in the electron beam.

FIG. 7 shows diagrammatically deviations in the focusing of an electron spot which are due to the chromatic aberration. For drafting this Figure a cylindrical electron beam is assumed, having an annular cross-section in the direction perpendicular to the axis and a cylinder axis which is coincident with the optical axis. The radius of the cylinder equals $r_0$, where $r_0=f\alpha$ (f=1/K is the focal distance of the focusing lens to be corrected, and $\alpha$ is the angle of aperture). The beam path in FIG. 7 has been obtained by computer simulation by means of a commercially available simulation program. This computer program is known as "TRC/TRASYS" and is commercially available from Delft Technical University, Department of Applied Physics, Particle Optics Group, Delft, the Netherlands. The electrical and magnetic fields used in said simulation program have been calculated by means of a number of other programs which are known as "MLD, Magnetic Lens Design", "MMD, Magnetic Multipole Design", "ELD, Electrostatic Lens Design" and "EMD, Electrostatic Multipole Design" and are also commercially available from said Delft Technical University. The graphs of the FIGS. 4, 5 and 6 have also been determined by means of the latter programs. FIG. 7 shows the cross-section of the electron beam in the paraxial image plane of a focusing lens. In this Figure the focusing lens was provided with a correction device and it was assumed that no spherical aberration occurred. Furthermore, the imaging parameters in this Figure have the following values: $C_c$=5 mm, f=5 mm, $\alpha$=10 mrad, $U_0$=1000 V and the number of periods n of the sinusoidal trajectory of the electrons equals 1; the scale value in the image plane is indicated as along the axes in the Figure. The image points formed by the triangles represent the situation with an energy deviation ΔU amounting to −0.2 eV; the image points formed by the + signs represent the situation without energy deviation (ΔU=0), and the image points formed by the circles represent the situation with an energy deviation ΔU amounting to 0.2 eV. In this case it thus appears that the spot size is approximately 1 nm. In the same situation the same beam would have caused a spot having a diameter of approximately 5 nm in the case of a non-corrected focusing lens; the associated image points, however, have been omitted in the Figure because of the scale value.

We claim:

1. A particle-optical apparatus, including:
    a particle source for emitting a beam of electrically charged particles which travel along an optical axis of the apparatus in order to irradiate an object to be irradiated in the apparatus by means of the particle beam,
    a focusing lens for focusing the beam of electrically charged particles, and
    a correction device for correcting lens aberrations of the focusing lens (8),
        which correction device comprises pole faces for producing a uniform electrical field and a uniform magnetic field which extends perpendicularly thereto, both dipole fields also extending perpendicularly to the optical axis of the apparatus,
        which correction device also comprises pole faces for producing an electrical quadrupole field, which pole faces extend substantially parallel to the optical axis of the apparatus,
    in which for the length L in the direction of the optical axis of the pole faces for determining the multipole fields, it holds that this length is substantially equal to $(2\pi^2 n^2)/(K_{obj}^2 C_{c,obj})$, in which n is number of periods of the sinusoidal trajectory of the particles of the beam in the correction device, $K_{obj}$ is the strength of the focusing lens to be corrected, and $C_{c,obj}$ is the coefficient of chromatic aberration of this lens.

2. A particle-optical apparatus as claimed in claim 1, in which the dipole fields of the correction device have a strength such that the number of periods n of the sinusoidal trajectory of the particles of the beam equals 1.

3. A particle-optical apparatus as claimed in claim 1, in which the correction device is provided with pole faces which, with the exception of the pole face for producing the uniform magnetic field, are arranged to produce exclusively electrical fields.

4. A particle-optical apparatus as claimed in claim 1, which particle-optical apparatus is a scanning particle-optical apparatus with a spot-forming objective lens, the correction device therein being arranged ahead of the objective lens, looking from the particle source.

5. An assembly which consists of a focusing lens for focusing a beam of electrically charged particles and a correction device for correcting lens aberrations of the focusing lens as defined in any one of the preceding claims.

6. A particle-optical apparatus as claimed in claim 2, in which the correction device is provided with pole faces which, with the exception of the pole face for producing the uniform magnetic field, are arranged to produce exclusively electrical fields.

7. A particle-optical apparatus as claimed in claim 2, which particle-optical apparatus is a scanning particle-optical apparatus with a spot-forming objective lens, the correction device therein being arranged ahead of the objective lens, looking from the particle source.

8. A particle-optical apparatus as claimed in claim 3, which particle-optical apparatus is a scanning particle-optical apparatus with a spot-forming objective lens, the correction device therein being arranged ahead of the objective lens, looking from the particle source.

9. A method of manufacture of a particle-optical apparatus, comprising the steps of:
    providing a particle source for emitting a beam of electrically charged particles which travel along an optical axis of the apparatus in order to irradiate an object to be irradiated in the apparatus by means of the particle beam;
    providing a focusing lens for focusing the beam of electrically charged particles;
    providing a correction device for correcting lens aberrations of the focusing lens, in which correction device comprises pole faces for producing a uniform electrical field and a uniform magnetic field which extends perpendicularly thereto, both dipole fields also extending perpendicularly to the optical axis of the apparatus, in which correction device also comprises pole faces for producing an electrical quadrupole field, which pole faces extend substantially parallel to the optical axis of the apparatus;
    wherein for the length L in the direction of the optical axis of the pole faces determining the multipole fields it holds that this length is substantially equal to $(2\pi^2 n^2)/(K_{obj}^2 C_{c,obj})$, in which n is number of periods of the sinusoidal trajectory of the particles of the beam in the correction device, $K_{obj}$ is the strength of the focusing lens to be corrected, and $C_{c,obj}$ is the coefficient of chromatic aberration of this lens.

10. The method of claim 9, in which the dipole fields of the correction device have a strength such that the number of periods n of the sinusoidal trajectory of the particles of the beam equals 1.

11. The method of claim 9, in which the correction device is provided with pole faces which, with the exception of the pole face for producing the uniform magnetic field, are arranged to produce exclusively electrical fields.

12. The method of claim 9, which particle-optical apparatus is a scanning particle-optical apparatus with a spot-forming objective lens, the correction device therein being arranged ahead of the objective lens, looking from the particle source.

* * * * *